(12) United States Patent
Abraham (10) Patent No.: US 8,179,706 B2
(45) Date of Patent: *May 15, 2012

(54) METHOD FOR MODIFYING DATA MORE THAN ONCE IN A MULTI-LEVEL CELL MEMORY LOCATION WITHIN A MEMORY ARRAY

(75) Inventor: Michael M. Abraham, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/111,247

(22) Filed: May 19, 2011

(65) Prior Publication Data

US 2011/0222344 A1 Sep. 15, 2011

Related U.S. Application Data

(63) Continuation of application No. 12/073,265, filed on Mar. 3, 2008, now Pat. No. 7,961,488, which is a continuation of application No. 11/507,506, filed on Aug. 22, 2006, now Pat. No. 7,366,017.

(51) Int. Cl.
G11C 11/42 (2006.01)

(52) U.S. Cl. ...................................... 365/12; 365/185.03

(58) Field of Classification Search .................... 365/12, 365/185.3, 185.03
See application file for complete search history.

(56) References Cited

U.S. PATENT DOCUMENTS

| 6,081,447 A | 6/2000 | Lofgren et al. | |
|---|---|---|---|
| 6,975,538 B2 | 12/2005 | Abedifard et al. | |
| 6,982,905 B2 | 1/2006 | Nguyen | |
| 7,009,896 B2 * | 3/2006 | Yoon et al. | 365/200 |
| 7,246,195 B2 * | 7/2007 | Barfuss et al. | 711/103 |
| 7,301,839 B2 * | 11/2007 | Li et al. | 365/205 |
| 7,366,017 B2 * | 4/2008 | Abraham | 365/185.12 |
| 7,457,178 B2 * | 11/2008 | Tu et al. | 365/201 |
| 2002/0027805 A1 | 3/2002 | Roohparvar | |
| 2005/0195651 A1 | 9/2005 | Roohparvar | |
| 2006/0155922 A1 | 7/2006 | Gorobets et al. | |
| 2006/0161722 A1 | 7/2006 | Bennett et al. | |
| 2006/0227624 A1 * | 10/2006 | Shiga | 365/189.01 |
| 2006/0245249 A1 * | 11/2006 | Hwang | 365/185.11 |
| 2007/0097749 A1 * | 5/2007 | Li et al. | 365/185.22 |

* cited by examiner

*Primary Examiner* — Michael Tran
(74) *Attorney, Agent, or Firm* — Dickstein Shapiro LLP (57) ABSTRACT

A method and apparatus for marking a block of multi-level memory cells for performance of a block management function by programming at least one bit in a lower page of the memory cell block such that a first logic state is stored in the at least one bit in the lower page; programming at least one bit in an upper page of the memory cell block such that the first logic state is stored in the at least one bit in the upper page; reprogramming the at least one bit in the upper page such that the at least one bit transitions from the first logic state to a second logic state; identifying the first logic state in the at least one bit of a lower page and the transition of at least one corresponding bit in the upper page from the first logic state to the second logic state; and in response, marking the corresponding memory cell block for performance of a block management function.

20 Claims, 6 Drawing Sheets

METHOD FOR MODIFYING DATA MORE THAN ONCE IN A MULTI-LEVEL CELL MEMORY LOCATION WITHIN A MEMORY ARRAY

CROSS REFERENCE TO RELATED APPLICATIONS

This application is a continuation of U.S. patent application Ser. No. 12/073,265 filed Mar. 3, 2008, now U.S. Pat. No. 7,961,488, which is a continuation of U.S. patent application Ser. No. 11/507,506filed Aug. 22, 2006, now U.S. Pat. No. 7,366,017, the disclosures of which are incorporated herein.

FIELD OF THE INVENTION

The invention is directed to the management of pages and blocks of memory within a memory device.

BACKGROUND OF THE INVENTION

Flash memory devices are routinely used by computer users to store and retrieve programs, files, and/or other electronic data in nonvolatile memory. One type of flash memory device is a NAND Flash device. A NAND flash device typically utilizes a NAND Flash controller to write data to and read data from the NAND Flash device. The NAND Flash controller writes data to and reads data from the NAND Flash device page by page. Pages are typically grouped into blocks, where a block is the smallest erasable unit. For example, and without limitation, a typical memory device contains 2,112 bytes of memory per page and 64 pages of memory are contained in a block. The smallest entity that can be addressed within a page is a byte. A byte consists of eight bits, where a bit is the smallest allocable unit, logically representing a "1" or a "0."

A typical 2 gigabit (Gb) NAND device is organized as 2,048 blocks. Each block contains 64 pages. Each page has 2,112 bytes total, comprised of a 2,048-byte data area and a 64-byte spare area. The spare area is typically used for Error Correction Code (ECC), wear-leveling information, and other software overhead functions. Typically, there is no limitation as to how the data area and the spare area are partitioned on the page. The NAND Flash control determines the data and spare area partition boundaries.

When the data within the pages of a block are no longer required, the block is erased. Erasure of the block typically takes 2 to 3 milliseconds (mS) during which time the device cannot be used for other operations. In comparison, programming a page of memory within a block usually takes 300 to 1200 microseconds (μS), and a read operation takes 20 to 60 μS depending on the memory array. One or more blocks of memory can be erased during a period of time when the controller would otherwise be idle as long as the controller has selected or marked one or more blocks of memory for erasure.

The memory in a NAND Flash device utilizes memory cells to store one or more bits of data. NAND Flash devices that store two or more bits of data in one cell are often referred to as multi-level cell (MLC) NAND flash devices. NAND Flash devices that store one bit of data in one cell are often referred to as single-level cell (SLC) NAND Flash devices. In a single-level cell, this single bit of data is represented in one of two states, known as bit states. One bit state logically represents a "1" and the other logically represents a "0." In a multi-level cell that represents two bits of data, these two bits are represented in four bit states that logically represent "11," "10," "01", and "00." MLC technology results in obvious density advantages as shown in the example above in that two bits of data are represented in one memory cell instead of only one bit of data. The two bits of data are typically accessed using two pages within a block, a lower page and an upper page. If a typical SLC NAND Flash device has 64 pages per block the corresponding MLC NAND flash device has 128 pages per block. These pages are paired together, for example one bit within page zero is paired with one bit in the identical relative location in a different page. Data can then be stored in these bits on the different pages as further described below. One reason bits on different pages are paired together for programming operations involves error correction. If an error occurs during the programming process the error would manifest itself as a single bit error on two different pages which can be corrected, rather than two bit errors on a single page, which is more difficult to correct.

Typically, memory devices also move data from current blocks to unused blocks to avoid wearing out a particular memory block. This procedure is referred to as wear leveling. Wear leveling is used because, over time, the storage capacity of NAND Flash devices degrade as blocks are repeatedly used.

Currently, a number of rules exist to properly store and retrieve data from MLC NAND flash devices. For example, before first use a block of MLC NAND flash memory is left in an initial, erased state in which a "1" is stored in each memory location. Typically, specific bits of a page of a MLC NAND flash device are only permitted to be programmed once from its initial state to store data. Once data is stored in these specific bits of memory, these specific bits would typically need to be returned to their initial state, by an erasure operation on the block containing the specific bits, before new data could be stored in these bits. Once the erasure operation has been performed on all the bits contained in the block of memory, the specific bits of memory can be programmed again to store new information. The following rules are applicable to MLC NAND flash memory: 1) only a single bit within the memory cell can be programmed at a time since the two bits are represented as being in different pages; 2) a bit can be programmed from a higher logical state to a lower logical state (from a "1" to a "0"), but cannot be programmed from a lower logical state to a higher logical state (from a "0" to a "1"); and, 3) if a change in bit state occurs as a result of the programming step, the voltage of the new bit state must equal to, or exceed the voltage level of the previous bit state for the MLC NAND memory cell.

U.S. Pat. No. 6,982,905 entitled "METHOD AND APPARATUS FOR READING NAND FLASH MEMORY ARRAY" and U.S. Pat. No. 6,975,538 entitled "MEMORY BLOCK ERASING IN A FLASH MEMORY DEVICE" are commonly assigned to the assignee of the current application and are hereby incorporated, in their entirety, herein. Additionally, U.S. Patent Application Nos. 09/303,843 entitled "APPARATUS AND METHOD FOR PROGRAMMING VOLTAGE PROTECTION IN AN NON-VOLATILE MEMORY SYSTEM" publication no. US 2002/0027805; and 11/122,708 entitled "NAND FLASH MEMORY WITH IMPROVED READ AND VERIFICATION THRESHOLD UNIFORMITY" publication no. US 2005/0195651 are commonly assigned to the assignee of the current application and are hereby incorporated, in their entirety, herein.

A need exists for a faster way to target a block of memory contained in a MLC NAND flash memory cell for erasure. The targeted block of memory could then be erased during a time when the controller would otherwise be idle. Often which blocks are marked for erasure are stored by the controller, but in case the power is removed from the controller a method must exist to store this information in the NAND Flash memory device. This data is often stored within a location in the block that is to be erased. If old data is already in the block to be erased (hence the need for erasure) then at least one of the pages within the block must be programmed in a manner whereby the controller will know that the block is marked for erasure. If the power is removed from the controller, when power is reapplied the controller will know which blocks are marked for erasure. A need therefore exists for a method to program a page within a block more than once. In the first time, valid data will be programmed into the page containing valid data. In the second time, a mark must be programmed into the page to indicate that its block is ready for erasure.

BRIEF DESCRIPTION OF THE DRAWINGS

The foregoing and other advantages and features of the invention will become apparent from the detailed description of exemplary embodiments provided below with reference to the accompanying drawings in which.

DETAILED DESCRIPTION OF THE INVENTION

In the following detailed description, reference is made to the accompanying drawings, which are part of the specification, and in which is shown by way of illustration various embodiments whereby the invention may be practiced. These embodiments are described in sufficient detail to enable those skilled in the art to make and use the invention. It is to be understood that other embodiments may be utilized, and that structural, logical, and electrical changes, as well as changes in the materials used, may be made without departing from the spirit and scope of the present invention. As described in detail below, a desired embodiment of the invention reduces the time required to mark a block for erasure, or other block management functions, by allowing one or more bits in an upper page to be reprogrammed in certain instances.

Figure 1:
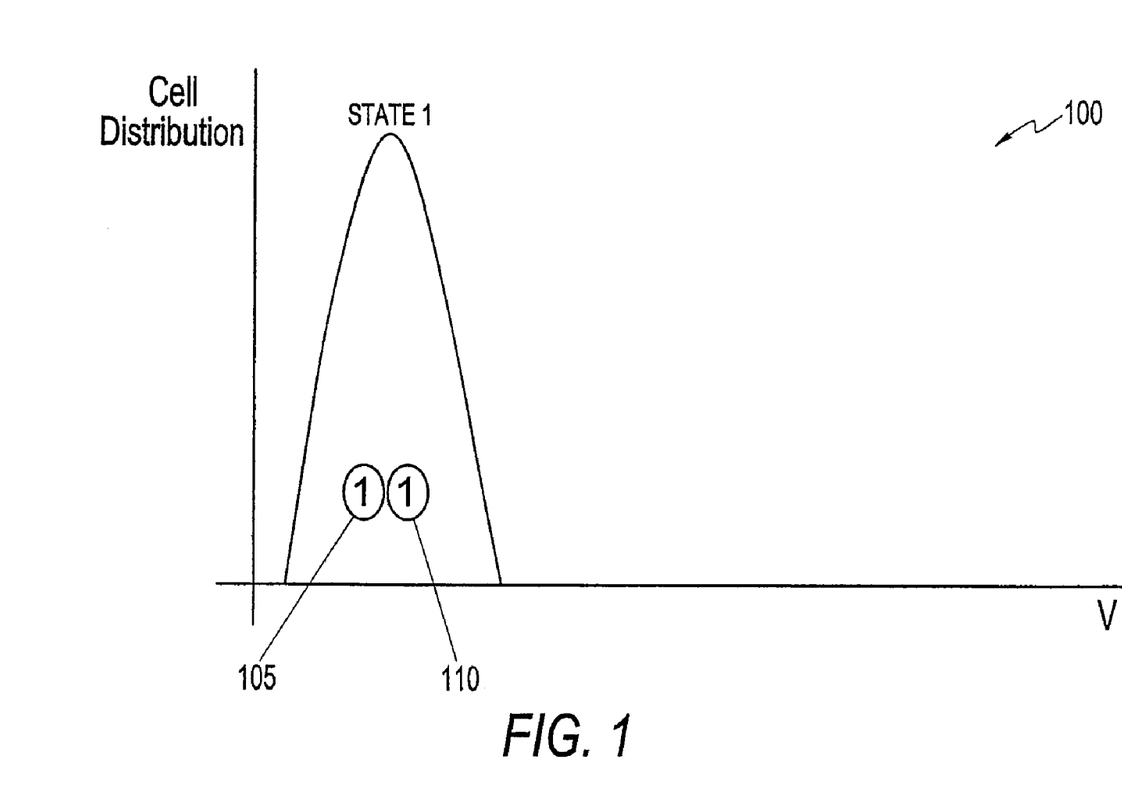
FIG. 1 depicts the initial, or erased, state of a multi-level cell NAND Flash memory cell.

FIG. 1 illustrates the initial, or erased, state 100 of a Multi-Level Cell NAND Flash memory cell. FIG. 1 shows the value of the bit in the upper page 105 and the value of the bit in the lower page 110 in State 1. As illustrated, both bits have been initialized to "1." Initializing the value of both bits to "1" is necessary to allow programming of the bits at a later time. In accordance with the rules outlined above, the first bit to be programmed is the bit in the lower page.

Figure 2:
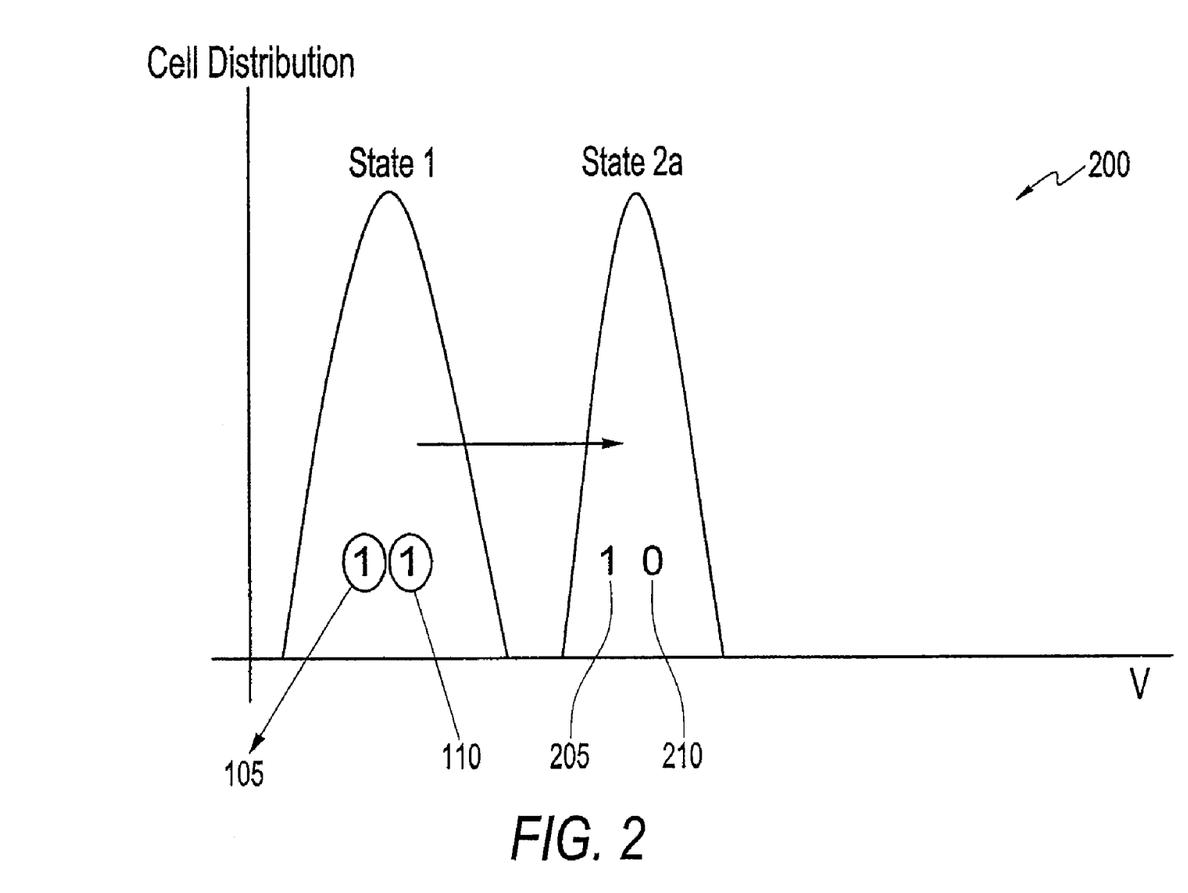
FIG. 2 depicts the possible states of the multi-level cell NAND Flash memory cell of FIG. 1 after the lower page has been programmed.

FIG. 2 illustrates the two possible states 200, State 1 and State 2a, after the bit in the lower page has been programmed. If the bit in the lower page was programmed to store a "1," the MLC NAND flash memory cell remains in State 1 indicating that a "1" is stored in the bit in the lower page (which has been programmed) 110 and a "1" is stored in the bit in the upper page (which has not yet been programmed) 105. In this case, since both the initial state and the final state of the MLC NAND flash memory cell are State 1, the voltage level associated with the state remains constant. As shown by FIG. 2, the voltage level of the memory cell increases as the state moves from the left of the figure to the right. If, however, the bit in the lower page was programmed to store a "0," the MLC NAND flash memory cell moves to State 2a indicating that a "1" is stored in the bit in the upper page (which has not yet been programmed) 205 and a "0" is stored in the bit in the lower page (which has been programmed) 210. In this case the voltage associated with the state increases as depicted in FIG. 2.

Figure 3:
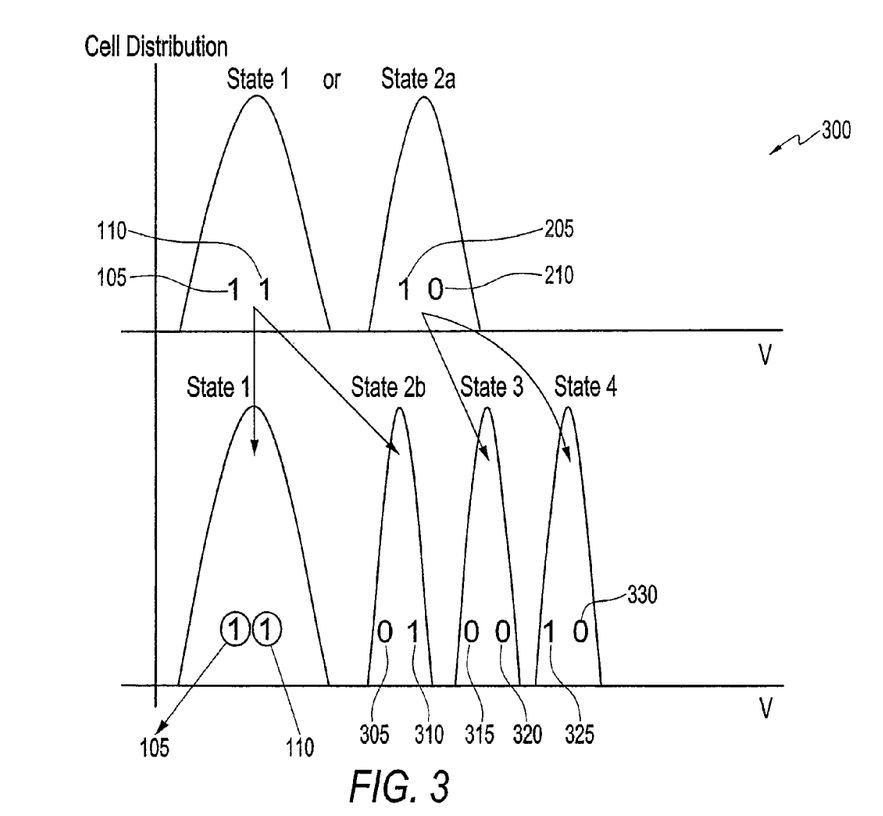
FIG. 3 illustrates the allowable transitions from the states possible after the lower page has been programmed to the states possible after the upper page has been programmed.

FIG. 3 illustrates the allowable transitions 300 from the bit states possible after the lower page has been programmed to the bit states possible after the upper page has been programmed. The upper portion of FIG. 3 illustrates the two possible bit states after the lower page has been programmed and the lower portion of FIG. 3 illustrates the four possible bit states after the bit in the upper page has been programmed. Two of the bit states in the lower portion of FIG. 3 (States 1 and 2b) are possible from State 1 (in which the value for the bits in the lower page and the upper page are set to "1") and two of the bit states (States 3 and 4) are possible from State 2a (in which the value for the bit in the upper page is "1" and the bit in the lower page is "0"). Of the five different states depicted in FIG. 3, State 1 has the lowest voltage level, State 2b has the next highest voltage, followed by State 2a, State 3 and State 4 in increasing order. Because the voltage within a memory cell falls into a distribution, it is possible that there is some overlap of distributions between State 2a and States 2b and 3.

The two states possible from State 1 are now discussed. If the bit in the lower page was programmed to store a "1," and the bit in the upper page was also programmed to store a "1," the MLC NAND flash memory cell remains in State 1 indicating that a "1" is stored in the bit in the upper page (which has been programmed) 105 and a "1" is stored in the bit in the lower page (which has been programmed) 110. In this case, since the MLC NAND flash memory cell began and ended in State 1, the voltage of the state associated with the MLC NAND flash memory cell remains constant. If, however, the bit in the lower page was programmed to store a "1," and the bit in the upper page was programmed to store a "0," the MLC NAND flash memory cell moves from State 1 to State 2b indicating that a "0" is stored in the bit in the upper page (which has been programmed) 305 and a "1" is stored in the bit in the lower page 310 (which has been programmed In this case, as shown in FIG. 3, the voltage of the state increases from State 1 to State 2b.

The two states possible from State 2a are now discussed. To be at State 2a, the bit in the lower page was previously programmed to a "0" and the upper page has not yet been programmed. In State 2a a "1" is stored in the bit of the upper page and a "0" is stored in the bit of the lower page. If the bit in the upper page is programmed to store a "0," the MLC NAND flash memory cell moves to State 3 indicating that a "0" is stored in the bit in the upper page 315 (which has been programmed) and a "0" is stored in the bit in the lower page 320 (which has also been programmed). In this case, as shown in FIG. 3, the voltage of the state associated with the MLC NAND flash memory cell increases from State 2a to State 3. If, however, the bit in the upper page is programmed to store a "1," the MLC NAND flash memory cell moves from State 2a to State 4 indicating that a "1" is stored in the bit in the upper page 325 (which has been programmed) and a "0" is stored in the bit in the lower page 330 (which has also been programmed). In this case the voltage of the state associated with the MLC NAND flash memory cell increases from State 2a to State 4. Once the upper page has been programmed, transitions from State 4 to States 3, 2b, 2a, or 1 would violate one or more of the rules previously discussed. For example, a transition from State 4 to States 3, 2b, 2a, or 1 would require the voltage of the state associated with the MLC NAND flash memory cell to be reduced, which would violate one of the previously described rules. In addition, transition from State 3 to States 4, 2b, 2a, or 1; transition from State 2b to States 4, 3, 2a, or 1; and transition from State 1 to States 3 or 4 would violate one, or more, of the rules discussed previously. After the upper page is programmed, the transition from State 1 to State 2b is permissible as it does not violate the rules previously discussed.

As shown by FIG. 3, the value of bits in both the upper and lower pages in State 1 is "1." Also as shown by FIG. 3, the value of the bit in the upper page in State 2b is "0" while the value of the bit in the lower page of State 2b is "1." Transitioning from State 1 to State 2b would require the bit in the upper page to be changed from a "1" to a "0." This transition would not violate any of the rules previously discussed in that: 1) before the first use the MLC NAND flash memory cell was in an initial state in which a "1" was stored in each bit of the lower and the upper pages; 2) only a single bit is being programmed at a time; 3) the bit in the upper page is being programmed from a higher logical value to a lower logical value (from a "1" to a "0"), and, 4) the change in the state associated with the MLC NAND flash memory cell would be from State 1 to State 2b which would result in an increase voltage for the state. The transition from State 1 to State 2b is the same as changing the bit in the upper page from "1" to "0" and is possible if, and only if, the bit value in the corresponding lower page is set to "1."

Figure 4:
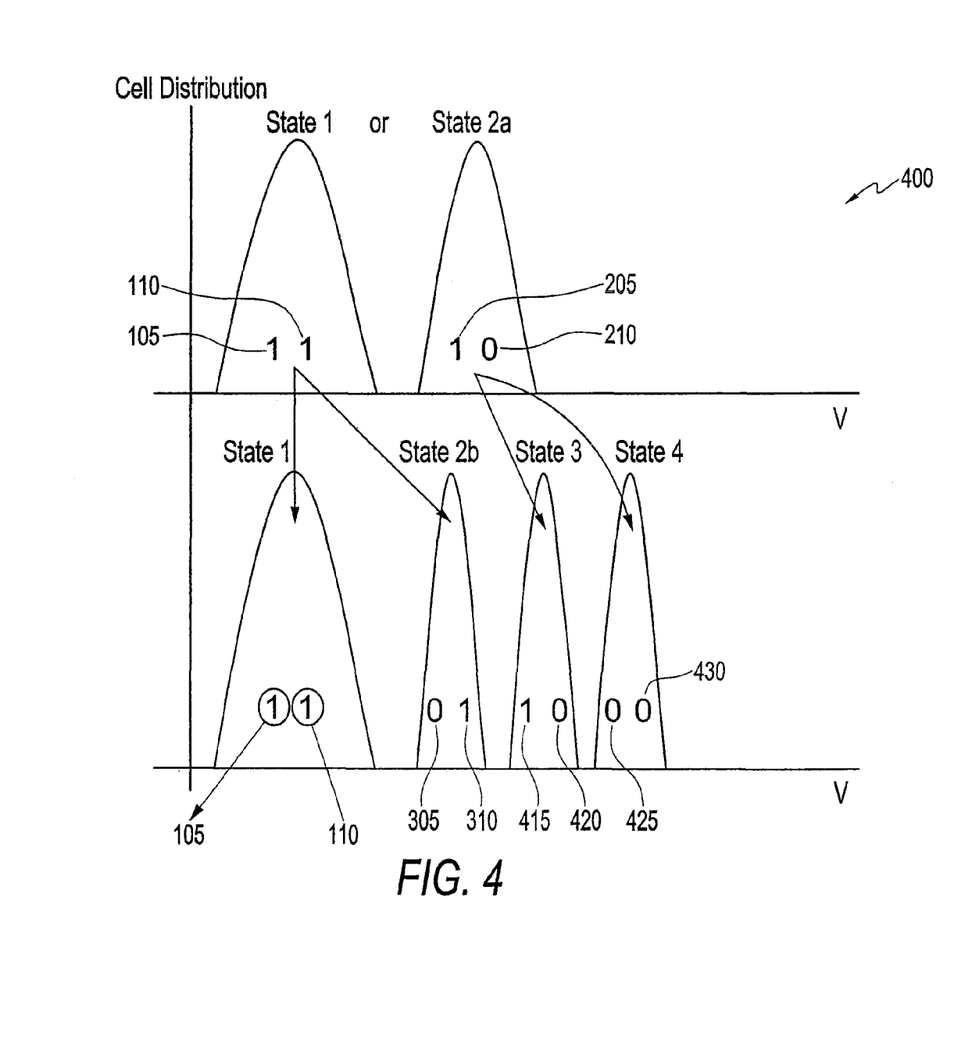
FIG. 4 shows an alternative method of allowable transitions from the states possible after the lower page has been programmed to the states possible after the upper page has been programmed.

FIG. 4 shows an alternative arrangement of the bit state after the upper page has been programmed, as compared to FIG. 3. The values of bit in the upper page, 415 and 425 are opposite 315 and 325, respectively. Similar to FIG. 3, FIG. 4 illustrates the allowable transitions 400 from the bit states possible after the lower page has been programmed to the bit states possible after the upper page has been programmed. The upper portion of FIG. 4 illustrates the two possible bit states after the lower page has been programmed and the lower portion of FIG. 4 illustrates the four possible bit states after the bit in the upper page has been programmed. Two of the bit states in the lower portion of FIG. 4 (States 1 and 2b) are possible from State 1 (in which the value for the bits in the lower page and the upper page are set to "1") and two of the bits (States 3 and 4) are possible from State 2a (in which the value for the bit in the upper page is "1" and the bit in the lower page is "0"). Of the five different states depicted in FIG. 4, State 1 has the lowest voltage level, State 2b has the next highest voltage, followed by State 2a, State 3 and State 4 in increasing order. Because the voltage within a memory cell falls into a distribution, it is possible that there is some overlap of distributions between State 2a and States 2b and 3.

In FIG. 4, the two states possible from State 1 are identical to FIG. 3 as described in paragraph [0021].

Referring now to the two states possible from State 2a, to be at State 2a, the bit in the lower page was previously programmed to be a "0" and the upper page has not yet been programmed. In State 2a a "1" is stored in the bit of the upper page and a "0" is stored in the bit of the lower page. If the bit in the upper page is programmed to store a "1," the MLC NAND flash memory cell moves to State 3 indicating that a "1" is stored in the bit in the upper page 415 (which has been programmed) and a "0" is stored in the bit in the lower page 420 (which has also been programmed). In this case, as shown in FIG. 4, the voltage of the state associated with the MLC NAND flash memory cell increases from State 2a to State 3. If, however, the bit in the upper page is programmed to store a "0," the MLC NAND flash memory cell moves from State 2a to State 4 indicating that a "0" is stored in the bit in the upper page 425 (which has been programmed) and a "0" is stored in the bit in the lower page 430 (which has also been programmed). In this case the voltage of the state associated with the MLC NAND flash memory cell increases from State 2a to State 4. Once the upper page has been programmed, transitions from State 4 to States 3, 2b, 2a, or 1 would violate one or more of the rules previously discussed. For example, a transition from State 4 to States 3, 2b, 2a, or 1 would require the voltage of the state associated with the MLC NAND flash memory cell to be reduced, which would violate one of the previously described rules. In addition, transition from State 3 to States 2b, 2a, or 1, transition from State 2b to States 3 or 1; and transition from State 1to State 4 would violate one, or more of the rules discussed previously. After the upper page has been programmed, the transition from State 1 to State 2b, from State 2b to State 4, and from State 3 to State 4 are permitted as these transitions do not violate any of the rules previously discussed.

As shown by FIG. 3 and FIG. 4, the value of both bits in both the upper and lower pages in State 1 is "1."Also as shown by FIG. 3 and FIG. 4, the value of the bit in the upper page in State 2b is "0" while the value of the bit in the lower page of State 2b is "1." Transitioning from State 1 to State 2b would require the bit in the upper page to be changed from a "1" to a "0." This transition would not violate any of the rules previously discussed in that: 1) before the first use the MLC NAND flash memory cell as in an initial state in which a "1" was stored in each bit of the lower and the upper pages; 2) only a single bit is being programmed at a time; 3) the bit in the upper page is being programmed from a higher logical value to a lower logical value ("1" to 0"), and, 4) the change in the state associated with the MLC NAND flash memory cell would be from State 1 to State 2b which would result in an increase voltage for the state. The transition from State 1 to State 2b is the same as changing the bit in the upper page from "1" to "0" and is possible if, and only if, the bit value in the corresponding lower page is set to "1."

For example, and without limitation, the last page in a block, page 127, is an upper page and page 127 is paired to a lower page. A bit in upper page 127 can be reprogrammed in the locations where the bit in the corresponding lower page has a "1" stored. For example, if it is desired to program column address (bytes) 2049-2052 a second time overriding programmed data with "00h-00h-00h-00h" in the upper page (page 127), column address 2049-2052 would need to be programmed with "FFh-FFh-FFh-FFh" in the corresponding lower page prior to the upper page being programmed from the erased state. Using this method, the controller associated with this memory could then be programmed to mark the corresponding block for erasure. Using the method described, any and all upper pages in the MLC NAND flash device may be marked for erasure without requiring the erasure operation to occur immediately. Additionally, the present invention can be used to implement other block management functions other than marking the corresponding block for erasure. One novel aspect of this embodiment of the invention is that the value stored in the bit of the lower page determines whether or not the bit in the upper page can be programmed more than once. Another novel aspect of this embodiment is that the method of programming works with both bit state figures, FIG. 3 and FIG. 4.

Figure 5:
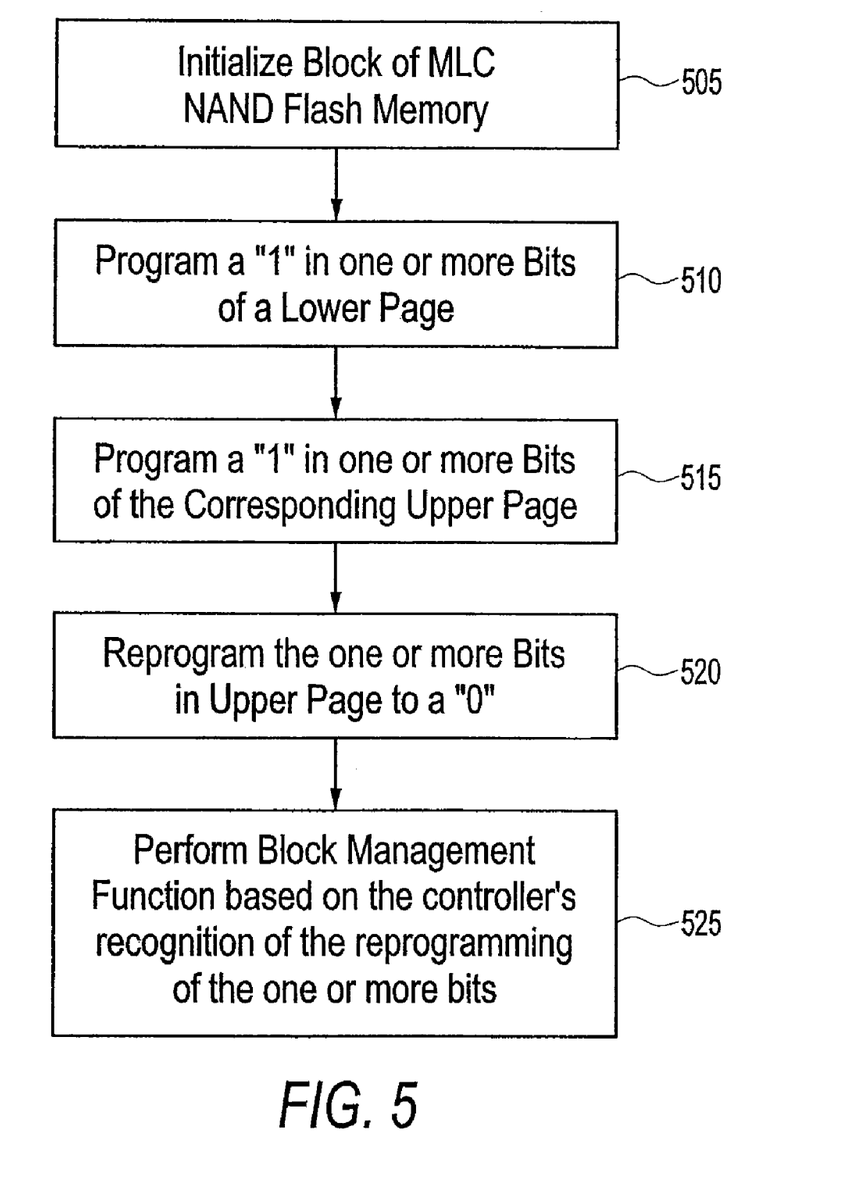
FIG. 5 shows a flow chart of the method of reprogramming a bit in the upper page from a "1" to a "0" to identify and mark a block for block management purposes such as an erasure.

FIG. 5 shows a flow chart of the method of using the reprogramming of the bit in the upper page from a "1" to a "0" to identify and mark a block for erasure or other block management functions. In step 505 a block of memory is initialized, or erased, such that a "1" is stored in each bit of the memory. In step 510 one or more bits of the lower page are programmed with a "1." In step 515 one or more bits in the upper page corresponding to the lower page are programmed with a "1." In step 520 the one or more bits in the upper page programmed in step 515 are reprogrammed such that a "0" is then stored in the bits. This step of reprogramming can only occur in the described memory scheme when a "1" is programmed in the bit of the corresponding lower page. Finally, in step 525, based on a controller's recognition of the reprogramming of the one or more bits, a block management function, such as an erasure, can occur. The block management functions may occur immediately or at some later time.

Figure 6:
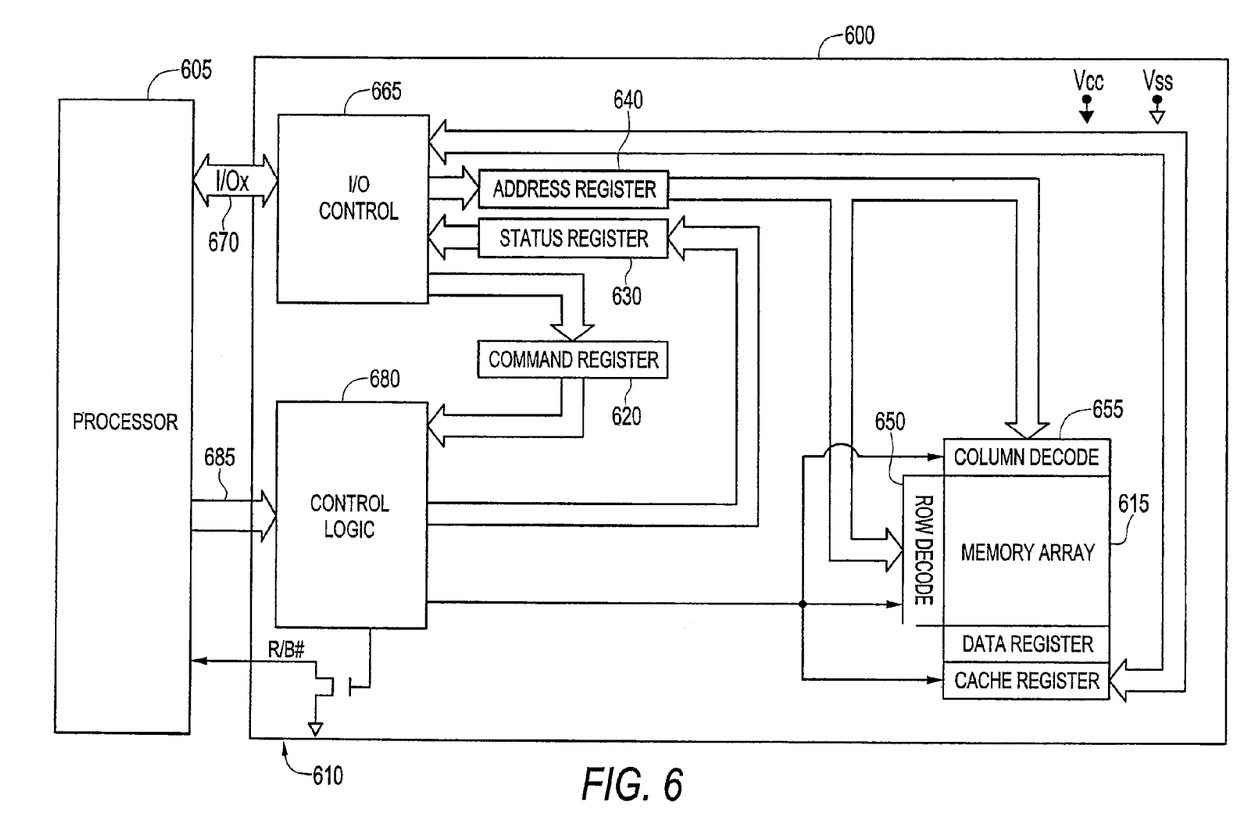
FIG. 6 shows a block diagram of one embodiment of an electronic system of the present invention incorporating the method of marking a block for block management purposes such as an erasure of FIG. 5.

FIG. 6 illustrates a functional block diagram of a memory device 600 that incorporates multi-level NAND flash memory cells and a processor or controller 605 coupled to memory device 600 which includes programming code to mark a block for erasure in accordance with the present invention. The processor 605 may be a microprocessor or some other type of controlling circuitry. The memory device 600 and the processor 605 form part of an electronic system 610. The memory device includes an array of multi-level memory cells 615. In one embodiment, the memory cells are non-volatile floating-gate memory cells and the memory array 615 is arranged in banks of rows and columns.

Command, address, and data are input and data is output over a plurality of bi-directional data connections 670. An address register circuit 640 is provided to latch address signals as instructed by I/O control 665 and control logic 680. Address signals are received and decoded by a row decoder 650 and a column decoder 655 to access the memory array 615.

Control circuitry 680 decodes signals provided on control connections 685 from the processor 605. These signals are used to control the operations on the memory array 615, including command, address, and data input and data output. The control circuitry 680 may be a state machine, a sequencer, or some other type of controller, which executes the process routine illustrated in FIG. 5.

The flash memory device illustrated in FIG. 6 has been simplified to facilitate a basic understanding of the features of the memory. A more detailed understanding of internal circuitry and functions of flash memories are known to those skilled in the art.

The invention claimed is:

1. A method, comprising:
    programming at least one bit in a lower page of a memory cell block containing multi-level cells such that a first logic state is stored in the at least one bit in the lower page;
    programming at least one bit in an upper page of the memory cell block such that the first logic state is stored in the at least one bit in the upper page;
    reprogramming the at least one bit in the upper page such that the at least one bit transitions from the first logic state to a second logic state;
    identifying the first logic state in the at least one bit of a lower page and the transition of at least one corresponding bit in the upper page from the first logic state to the second logic state; and
    in response, marking the corresponding memory cell block for performance of a block management function.

2. The method of claim 1, further including the step of:
    initializing the at least one bit in the lower page and the at least one bit in the upper page of the memory cell block by storing the first logic state in each of the bits.

3. The method of claim 1 wherein the block management function notates the memory cell block for erasure.

4. The method of claim 3 further including the step of:
    erasing the memory cell block during a period of time when an associated controller is otherwise idle.

5. The method of claim 1 wherein the block management function notates the memory cell block for invalidation.

6. The method of claim 1 wherein the block management function notates the memory cell block as unusable.

7. The method of claim 1, wherein the first logic state corresponds to a bit value of one, and the second logic state to a bit value of zero.

8. A controller operable to run programming code stored on a non-transitory computer-readable medium, the programming code comprising:
    programming code to program at least one bit in a lower page of a memory cell block containing multi-level cells such that a first logic state is stored in the at least one bit in the lower page;
    programming code to program at least one bit in an upper page of the memory cell block such that the first logic state is stored in the at least one bit in the upper page;
    programming code to reprogram the at least one bit in the upper page such that the at least one bit transitions from the first logic state to a second logic state;
    programming code to identify the first logic state in the at least one bit of a lower page and the transition of at least one corresponding bit in the upper page from the first logic state to the second logic state, and in response, mark the corresponding memory cell block for performance of a block management function.

9. The controller of claim 8, wherein the programming code further comprises:
    programming code to initialize the at least one bit in the lower page and the at least one bit in the upper page of the memory cell block by storing the first logic state in each of the bits.

10. The controller of claim 8, wherein the block management function notates the memory cell block for erasure.

11. The controller of claim 8, wherein the programming code further comprises:
    programming code to erase the memory cell block during a period of time when an associated controller is otherwise idle.

12. The controller of claim 8, wherein the block management function notates the memory cell block for invalidation.

13. The controller of claim 8, wherein the block management function notates the memory cell block as unusable.

14. The controller of claim 8, wherein the first logic state corresponds to a bit value of one, and the second logic state to a bit value of zero.

15. The controller of claim 8, wherein the multi-level memory cells are multi-level NAND Flash memory cells.

16. A method, comprising:
    identifying a first logic state in a bit of a lower page of a multi-level cell contained in a memory cell block and a transition of a corresponding bit in the upper page of the multi-level cell from said first logic state to a second logic state; and in response, marking the memory cell block containing the multi-level cell for performance of a block management function.

17. The method of claim 16, wherein the block management function notates the memory cell block for erasure.

18. The method of claim 16, wherein the block management function notates the memory cell block as unusable.

19. The method of claim 17, further including:

erasing the marked memory cell block during a period of time when an associated controller is otherwise idle.

20. The method of claim 16, wherein the first logic state corresponds to a bit value of one, and the second logic state to a bit value of zero.

* * * * *

UNITED STATES PATENT AND TRADEMARK OFFICE
CERTIFICATE OF CORRECTION

PATENT NO. : 8,179,706 B2
APPLICATION NO. : 13/111247
DATED : May 15, 2012
INVENTOR(S) : Michael M. Abraham

Page 1 of 1

It is certified that error appears in the above-identified patent and that said Letters Patent is hereby corrected as shown below:

On the face page, in field (63), under "Related U.S. Application", in column 1, line 3, delete "11/507,506" and insert -- 11/507,596 --, therefor.

In column 1, line 12, delete "11/507,506filed" and insert -- 11/507,596 filed --, therefor.

Signed and Sealed this
Thirty-first Day of July, 2012

David J. Kappos
*Director of the United States Patent and Trademark Office*